(12) United States Patent
MacLaren et al.

(10) Patent No.: US 7,353,328 B2
(45) Date of Patent: Apr. 1, 2008

(54) MEMORY TESTING

(75) Inventors: John MacLaren, Cypress, TX (US); Thomas J. Bonola, Magnolia, TX (US); Jerry Johnson, Spring, TX (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 296 days.

(21) Appl. No.: 10/812,149

(22) Filed: Mar. 29, 2004

(65) Prior Publication Data

US 2005/0223265 A1   Oct. 6, 2005

(51) Int. Cl.
*G06F 12/00* (2006.01)
(52) U.S. Cl. .............................. 711/105; 711/5; 714/718
(58) Field of Classification Search ................ 711/170; 714/5, 718
See application file for complete search history.

(56) References Cited

U.S. PATENT DOCUMENTS

| | | | | |
|---|---|---|---|---|
| 5,706,407 | A * | 1/1998 | Nakamura et al. | 700/251 |
| 6,108,798 | A * | 8/2000 | Heidel et al. | 714/30 |
| 6,408,343 | B1 * | 6/2002 | Erickson et al. | 710/15 |
| 6,453,398 | B1 * | 9/2002 | McKenzie | 711/165 |
| 2001/0029592 | A1 * | 10/2001 | Walker et al. | 714/42 |
| 2002/0053010 | A1 * | 5/2002 | Piccirillo et al. | 711/170 |

* cited by examiner

*Primary Examiner*—Hyung S. Sough
*Assistant Examiner*—Thanh D. Vo

(57) ABSTRACT

A memory subsystem may be usable in an electronic system. The memory subsystem may comprise a memory controller and a plurality of memory modules coupled to the memory controller. The memory module may be isolated wherein transactions that target the isolated memory module can complete without loss of data and without accessing the isolated memory module, and while isolated, the memory module can be tested.

17 Claims, 2 Drawing Sheets

MEMORY TESTING

It is generally desirable to test memory before adding the memory to a computer system, or at least before the memory becomes usable by the computer system. Memory diagnostic tests generally determine whether the memory is fully functional. If the diagnostics determines that the memory is insufficiently operational, the system may preclude the memory from being used by the operating system and a user may be alerted to replace the memory module with a new memory module and again run the diagnostic tests.

At least some systems permit memory, and other components, to be "hot plugged" meaning that the memory can be physically installed and removed from the system while the system is operational. Improvements in the area of diagnostics pertaining to hot pluggable devices (e.g., memory) are generally desirable.

BRIEF DESCRIPTION OF THE DRAWINGS

For a detailed description of some embodiments of the invention, reference will now be made to the accompanying drawings in which.

NOTATION AND NOMENCLATURE

Certain terms are used throughout the following description and claims to refer to particular system components. As one skilled in the art will appreciate, computer companies may refer to a component by different names. This document does not intend to distinguish between components that differ in name but not function. In the following discussion and in the claims, the terms "including" and "comprising" are used in an open-ended fashion, and thus should be interpreted to mean "including, but not limited to . . . ". Also, the term "couple" or "couples" is intended to mean either an indirect or direct electrical connection. Thus, if a first device couples to a second device, that connection may be through a direct electrical connection, or through an indirect electrical connection via other devices and connections.

DETAILED DESCRIPTION

The following discussion is directed to various embodiments of the invention. Although one or more of these embodiments may be preferred, the embodiments disclosed should not be interpreted, or otherwise used, as limiting the scope of the disclosure, including the claims. In addition, one skilled in the art will understand that the following description has broad application, and the discussion of any embodiment is meant only to be exemplary of that embodiment, and not intended to intimate that the scope of the disclosure, including the claims, is limited to that embodiment.

Figure 1:
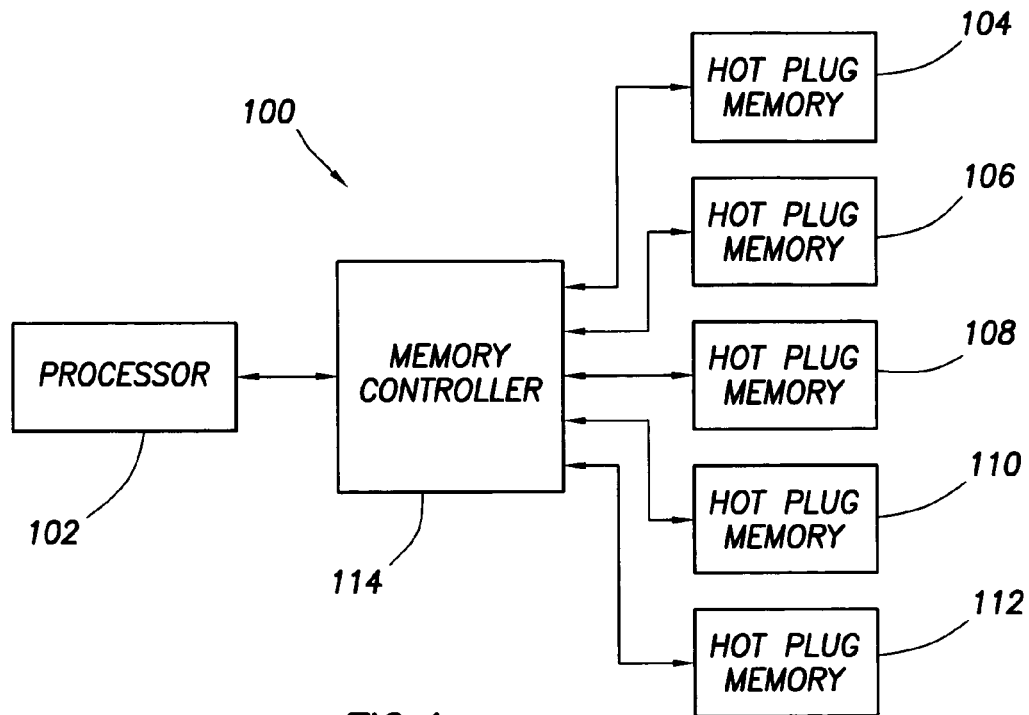
FIG. 1 shows a computer system having hot plug memory modules in accordance with various embodiments of the invention.

Referring now to FIG. 1, an electronic system 100 is shown in accordance with various embodiments of the invention. As shown, the system 100 may include a processor 102, a memory controller 114, and one or more memory modules 104, 106, 108, 110 and 112. The system 100 may be representative of any of a variety of electronic systems such as a computer system. Each memory module 104-112 may comprise "hot plug" memory. Hot plug memory modules may be inserted into and removed from the system 100 while the system is otherwise fully operational. Memory can be added to hot plug memory modules to expand the memory capacity of the system 100. Hot plug memory modules also may be used to replace an existing module that proves to be non-functional or memory on the modules can be replaced. The reason, however, for replacing or adding a hot plug memory module in to the system 100 is not relevant to this disclosure. Five hot plug memory modules 104-112 are shown in FIG. 1 although in accordance with other embodiments a different number of memory modules may be included as well (i.e., one or more).

Through the memory controller 114 the processor 102 may access any or all of the hot plug memory modules 104-112. Through the memory controller 114, the processor 102 may write data to or read data from the memory modules 104-112. Although not specifically shown, computer system 100 may include an operating system that is executed by processor 102. In general, once a hot plug memory module 104-112 is installed into the computer system 100, the installed memory module may become accessible to the computer system's operating system through a memory map.

Figure 2:
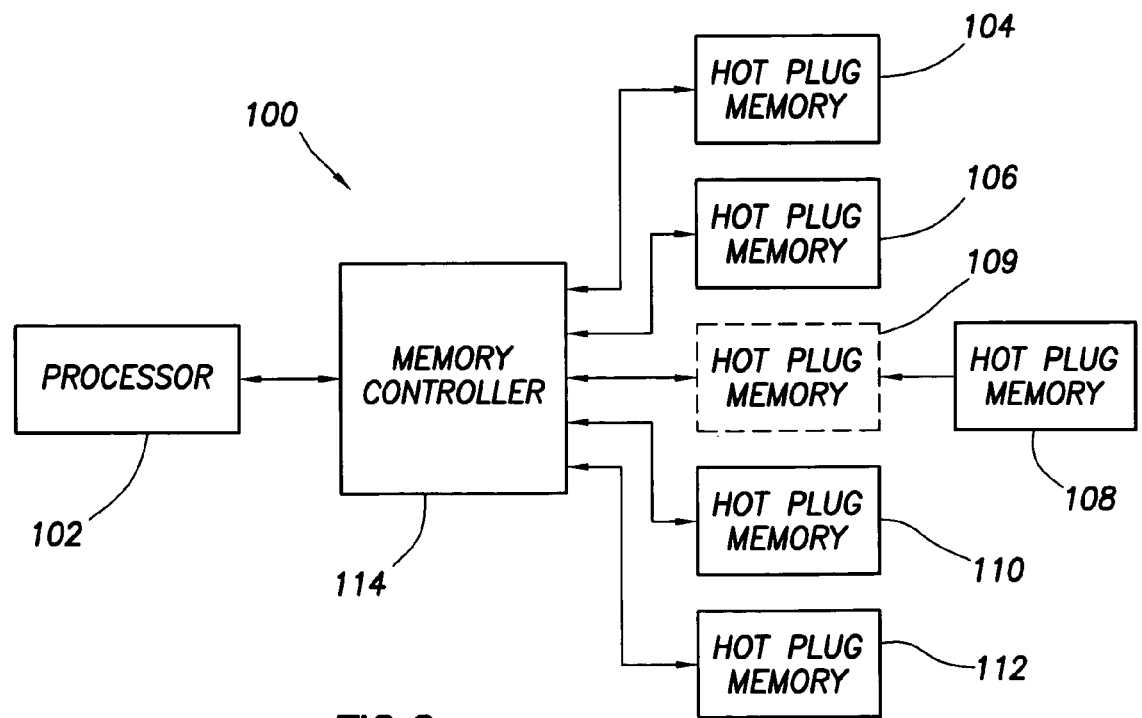
FIG. 2 shows the computer system of FIG. 1 in which one of the memory modules is inserted, but not available for use by the operating system in accordance with various embodiments of the invention.

FIG. 2 shows the computer system 100 largely the same as in FIG. 1. However, in FIG. 2 one of the hot plug memory modules 108 is depicted as being inserted into the computer system 100. In accordance with various embodiments of the invention, upon being inserted into the computer system, a hot plug memory module (e.g., hot plug memory module 108) may not become immediately accessible to the computer system's operating system as cacheable memory addresses mapped to the module. As such, the newly inserted module may be in an isolated state preventing read and write transactions from completing directly to the isolated module through the cacheable address region managed by the operation system. Nevertheless, the read and write transactions may still complete as a result of redundancy in the memory subsystem as explained below. The isolation is depicted in FIG. 2 by the dashed box versions 109 of hot plug memory module 108. While isolated, a diagnostic test may be performed on the newly installed module through an alternate set of uncacheable addresses that otherwise may be used by device drivers to perform memory-mapped I/O to an I/O device (not specifically shown). Various embodiments of a suitable diagnostic test are described below with respect to FIGS. 3 and 4. If the newly installed memory module passes the diagnostics, the module is unmapped from the uncacheable address region and remapped to the host operating system's cacheable address region that maps to an enumerated memory pool that is managed by the operating system. If, however, the newly installed module fails the diagnostics, the module may continue to be inaccessible to the operating system. In this way, a newly installed module is effectively isolated from the host system until its integrity can be verified by one or more diagnostic tests.

As explained above, reads and writes under the control of the operating system may not complete directly to the isolated memory module. In accordance with further embodiments of the invention, however, although isolated from the host system, read or write transactions under the control of the operating system that target the isolated module still can be performed without loss of data. As such, the computer system 100 effectively continues to complete transaction that target an isolated memory module, despite the module being inaccessible to the operating system.

Various techniques are available to permit read and write transactions to be performed to an isolated memory module and all such techniques are in included within the scope of this disclosure and the claims which follow. In accordance with at least one exemplary technique, the various hot plug memory modules 104-112 may comprise a redundant array of independent disks ("RAID") memory subsystem. A RAID memory subsystem typically includes one or more data modules and an associated parity module. As such, one of the hot plug memory modules 104-112 may function as a parity module. In general, the contents of any one hot plug memory module 104-112 may be computed as the exclusive-OR of the data included on the other modules. For example, the contents of hot plug memory module 104 may be computed by exclusive OR'ing the data on the remaining three modules 106-112. Thus, in general an extra parity module is included for redundancy to permit a module to fail without loss of data on the failed module. If a module fails, the data that was previously on the failed module may be regenerated by computing the exclusive-OR of the corresponding data on the other modules.

In accordance with various embodiments of the present invention, a RAID memory subsystem may permit one of the modules to be replaced and, although a newly inserted module is isolated from direct access by the computer system's operating system, as noted above, read and write transactions to the isolated module may be completed via the RAID paradigm. That is, rather than physically writing data to an isolated module, the write transaction may be performed by exclusive OR'ing the data to be written with the corresponding data elements from the other memory modules in accordance with the RAID's operation. As such, although the data to be written is not actually written to the isolated module, the target data of the write transaction may be regenerated from the other modules in the system by exclusive OR'ing the corresponding data elements. That the module is isolated from direct read/write access via the operating system is generally transparent to the operating system. Once the isolated memory module is verified as being sufficiently functional by the relevant diagnostic tests, the module is mapped into the memory map by suitable hardware and/or software (e.g., SMI). Further, as noted above, the data on the newly verified module is regenerated.

As described above, read and write transactions may continue to be performed to an isolated module by taking advantage of RAID memory subsystems inherent redundancy. In at least this way, transactions may complete without loss of data despite a module being isolated. Other types of memory subsystems may also include sufficient redundancy to permit read and write transactions to be performed to an isolated memory module. Such other memory subsystems may include memory mirroring and on-line spares.

Figure 3:
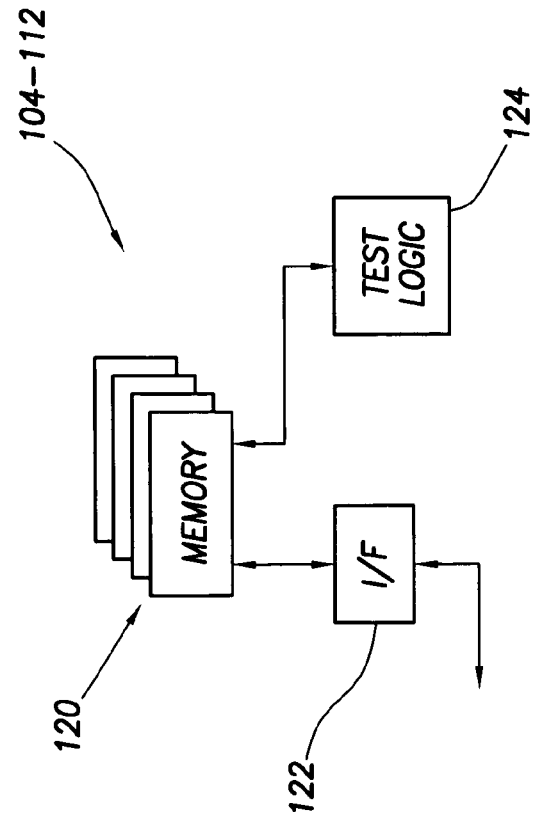
FIG. 3 shows a block diagram of a hot plug memory module in accordance with various embodiments of the invention.

The following discussion addresses several techniques for testing an isolated memory module. These techniques are generally exemplified in FIGS. 3 and 4. Referring first to FIG. 3, a hot plug memory module 104-112 may comprise one or more memory DIMMs 120, and interface logic 122, and a test logic 124. Both the interface logic 122 and test logic 124 may couple to and access the memory DIMMS 120 as shown. In this embodiment, each hot plug memory module may include its own test logic 124 to run diagnostics while it is isolated as described above. The memory module may be configurable to be in one of a plurality of states. One such state may correspond to an isolated state and another state may correspond to an un-isolated state (i.e., fully operational). As such, when the memory module initially is inserted into the host system 100, the interface logic 122 and/or test logic 124 may cause the newly installed memory module to transition to, or otherwise be in, the isolated state, thereby permitting the test logic to take control of the memory DIMMs 120 to run the diagnostics designed into the test logic 124. Once the test logic 124 completes the diagnostic testing of the memory DIMMs 120, the state of the module may transition from the isolated state to the un-isolated state to permit the host systems operating system to access the module.

Figure 4:
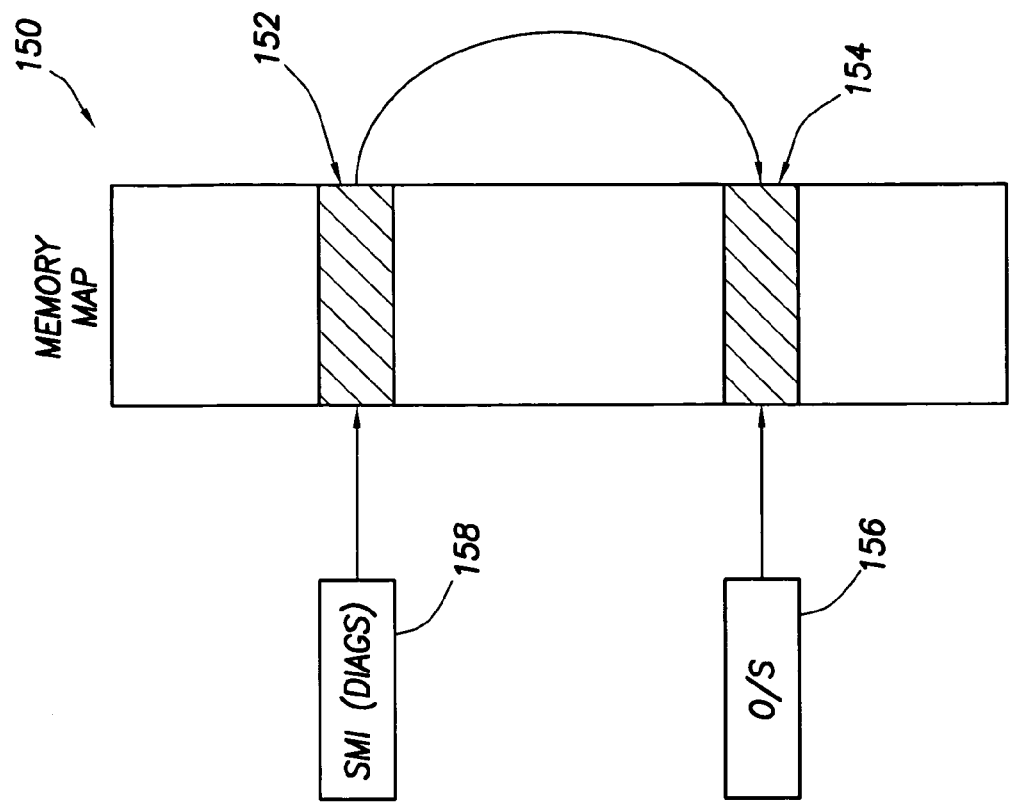
FIG. 4 shows a memory map usable in the computer system in accordance with other embodiments of the invention.

Another embodiment representing a suitable technique for concurrently testing and reading/writing an isolated module is shown in FIG. 4. FIG. 4 includes a representative memory map 150 associated with the host system 100. The memory map 150 includes a plurality of addressable regions, such as region 152 and 154. Addressable region 154 may comprise one or more addresses associated with a particular memory module 104-112 and therefore comprises the address range associated with an isolated memory module. Each memory module may have its own address region in the memory map 150. Addressable region 152 may generally correspond to an otherwise unused portion of the memory map 150 or a region that can be temporarily used for test purposes. An operating system 156, running on the host system's processor 102 may access a memory module 104-112 via the addressable region 154. If the memory module is isolated as described above, the operating system 156 still may address the isolated module via the addressable region 154 although the isolated memory modules are not accessed by the operating system 156. In this situation (i.e., an operating system addressing an isolated memory module), the redundancy inherent to the memory subsystem permits the operating system's read and/or write transactions to be performed. In this embodiment, the memory diagnostics may be performed by a system management interrupt ("SMI") mechanism 158. A SMI permits a processor 102 to run code without the involvement of the operating system. As such, a SMI routine 158 may be implemented as a memory diagnostic test. The diagnostic SMI 158 may access the isolated memory module via the addressable region 152 which may be mapped via hardware to addressable region 154 which corresponds to the isolated module.

In accordance with other embodiments, a module already present in the system may be transitioned to an isolated state. While isolated, the memory on the module may be tested and transactions targeting the isolated module may complete without loss of data due to the redundancy of the memory subsystem as explained above. The scope of this disclosure is not limited to the process of inserting a memory module or even to hot plug memory.

The above discussion is meant to be illustrative of the principles and various embodiments of the present invention. Numerous variations and modifications will become apparent to those skilled in the art once the above disclosure is fully appreciated. It is intended that the following claims be interpreted to embrace all such variations and modifications.

What is claimed is:

1. A computer system, comprising:
   a processor running an operating system; and
   a memory subsystem having a redundancy and coupled to said processor, said memory subsystem comprising a memory controller and a plurality of memory modules coupled to said memory controller;
   wherein a memory module is present in the computer system but isolated wherein, using the memory subsystem's redundancy, transactions that target said isolated memory module can complete without loss of data and without accessing said isolated memory module, and while isolated, said memory module is tested by one of a system management interrupt (SMI) handler that accesses said isolated memory module via an address in I/O space that is mapped to an address in memory space that corresponds to the isolated memory module or test logic internal to the memory module.

2. The computer system of claim 1 wherein data is not lost due to the redundancy of the memory subsystem.

3. The computer system of claim 1 wherein the memory subsystem comprises a RAID subsystem and read and write transactions can be completed that target said isolated memory module without loss of data using data from other memory modules.

4. The computer system of claim 1 wherein the memory subsystem comprises a mirrored configuration.

5. The computer system of claim 1 further including a memory map having a plurality of addresses, a first range of addresses corresponding to said isolated memory module and a second range of addresses that is mapped to said first range to permit said SMI handler access to said isolated memory module to run its code.

6. The computer system of claim 1 wherein, when isolated, an isolated memory module is isolated upon insertion into said system.

7. The computer system of claim 1 wherein the plurality of memory modules comprises hot plug modules.

8. A memory subsystem usable in an electronic system, comprising:
   a memory controller; and
   a plurality of hot plug memory modules that can be coupled to said memory controller and configured to provide redundancy;
   wherein a hot plug memory module may be inserted into said memory subsystem and caused to be inaccessible to an operating system and, based on the redundancy, transactions to said inserted memory module can complete without loss of data and without accessing said isolated memory module, and said inserted memory module, despite being inaccessible to the operating system, can be tested by one of a system management interrupt (SMI) handler that accesses said inserted memory module via an address that is mapped to an address corresponding to the isolated memory module or test logic internal to the inserted memory module.

9. The memory subsystem of claim 8 wherein the memory subsystem's redundancy is from a RAID configuration.

10. The memory subsystem of claim 9 wherein, when a hot plug memory module is inserted, the inserted memory module tests itself while inaccessible to the operating system.

11. The memory subsystem of claim 8 wherein the memory subsystem's redundancy is from a mirrored configuration.

12. A memory subsystem usable in an electronic system, comprising:
   a memory controller;
   connectors through which a plurality of hot plug memory modules can be coupled to said memory controller;
   a means for isolating a newly inserted memory module so as to preclude an operating system from causing data to be written to or read from said newly inserted memory module, yet completing transactions targeting said newly inserted memory module using redundancy of the memory subsystem, and for testing said memory module.

13. The memory subsystem of claim 12 wherein said means for isolating comprises a RAID memory subsystem.

14. The memory subsystem of claim 12 wherein said means for isolating comprises a memory map in which a first address range is associated with said newly inserted memory module and the memory map including a second address range that is mapped to the first address range to permit an interrupt handler to test said memory module.

15. A method, comprising:
   inserting a hot plug memory unit into a memory subsystem having redundancy;
   isolating said hot plug memory unit so that transactions targeting said hot plug memory unit can be completed using the redundancy of the memory subsystem, but not completed to the isolated hot plug memory unit; and
   testing said hot plug memory unit while said hot plug memory unit is isolated, said testing performed by one of a system management interrupt (SMI) handler that accesses said inserted hot plug memory unit via an address that is mapped to an address corresponding to the inserted hot plug memory or test logic internal to the inserted hot plug memory.

16. The method of claim 15, wherein upon completing said testing, terminating isolation of said hot plug memory unit to permit access to said hot plug memory unit by read and write transactions under the control of an operating system.

17. The method of claim 15 wherein testing includes accessing a range of logical address that are re-mapped to a different range of logical addresses that are associated with said isolated hot plug memory unit.

* * * * *